(12) United States Patent
Brown et al.

(10) Patent No.: US 7,095,239 B2
(45) Date of Patent: Aug. 22, 2006

(54) METHOD FOR DETECTING DEFECTS THAT EXHIBIT REPETITIVE PATTERNS

(75) Inventors: Diane L. Brown, San Jose, CA (US); Wolfgang Goubau, Santa Cruz, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 101 days.

(21) Appl. No.: 10/985,313

(22) Filed: Nov. 9, 2004

(65) Prior Publication Data

US 2006/0097729 A1    May 11, 2006

(51) Int. Cl.
G01R 31/08 (2006.01)
G01R 31/26 (2006.01)

(52) U.S. Cl. .................. 324/525; 324/719; 324/765

(58) Field of Classification Search .................. 324/525
See application file for complete search history.

(56) References Cited

U.S. PATENT DOCUMENTS

| | | | |
|---|---|---|---|
| 4,969,198 A | 11/1990 | Batchelder et al. | |
| 5,443,994 A * | 8/1995 | Solheim | 438/366 |
| 5,513,275 A | 4/1996 | Khalaj et al. | |
| 6,091,845 A | 7/2000 | Pierrat et al. | |
| 6,268,093 B1 | 7/2001 | Kenan et al. | |
| 2004/0057610 A1 | 3/2004 | Filseth et al. | |

* cited by examiner

*Primary Examiner*—Anjan Deb
*Assistant Examiner*—Timothy J. Dole
(74) *Attorney, Agent, or Firm*—Intellectual Property Law Offices

(57) ABSTRACT

A method for detecting defects in devices that are fabricated in repetitive patterns upon the surface of a substrate by the, repetitive utilization of masks and similar devices. A mask flaw will become manifest in a series of defective devices as the mask is successively utilized. The detection of repetitive defects is undertaken by determining the electrical resistance of devices in a group, such as a column, fabricated upon the wafer surface, where the repetitive defect will occur multiple times. The mean electrical resistance of the group is determined and a percent deviation of each device from the mean is then determined. The percent deviation of all of the devices in the group are multiplied together to create a multiplied percent deviation number and the multiplied percent deviation number is then compared with a figure of merit value to make a determination of whether defective devices exist within the group.

23 Claims, 3 Drawing Sheets

METHOD FOR DETECTING DEFECTS THAT EXHIBIT REPETITIVE PATTERNS

BACKGROUND OF THE INVENTION

1. Field of the Invention

The present invention relates generally to methods for detecting defects in devices fabricated on wafer substrates, and more particularly to a defect detection method for devices that are fabricated utilizing repetitive fabrication techniques such as are conducted with photolithographic masks.

2. Description of the Prior Art

Devices such as recording heads are typically fabricated in large numbers upon the surface of a wafer substrate, and following fabrication the wafers are sliced and diced to ultimately yield individual recording head devices. During the fabrication process, photolithographic techniques are employed which utilize a plurality of masks to shield and expose desired areas of the wafer surface for processing, as is well known to those skilled in the art. Such photolithographic masks are used in a repetitive manner to successively expose adjacent areas across the surface of the disk. Therefore, where a defect exists in an element of such a mask, the defect will repetitively inserted into particular devices on the substrate surface as the mask is successively utilized. The use of such a flawed mask, therefore creates a repetitive pattern of defective devices across the surface of the wafer.

Device testing for defects is conducted in the prior art by testing the electrical resistance of devices after they have been fabricated. In this regard, a resistance test range is developed and devices that exhibit a resistance within the range are deemed acceptable, while devices that exhibit a resistance beyond the range are deemed defective. A particular problem with this type of resistance testing is encountered in the testing of devices such as recording heads for tape drives. Such recording heads include a plurality of sensors disposed adjacent one another, and significantly, the resistance of each adjacent sensor typically differs from each other sensor. One reason for the resistance differences between the sensors is that the electrical lead lines of adjacent sensors differ in length. As a result, even though the sensors of a tape head might be virtually identical, the electrical resistance of the sensors will differ to a significant degree owing to the differing electrical lead line lengths of the sensor. As a result, a simple electrical resistance test requires a rather large range in order to not have good sensors be designated as defective because the electrical resistance of such sensors is beyond the acceptable test range. On the other hand, where the acceptable resistance test range is made large, defective sensors may be included within the acceptable test range. A defect range of 5 to 7% has been common in the prior art, where further analysis reveals that many of the devices initially identified as being defective are actually not defective. There is therefore a need for a test method that more accurately determines whether acceptable or defective devices exist on a wafer substrate.

SUMMARY OF THE INVENTION

The testing method of the present invention is particularly adapted to the testing of devices that are fabricated in repetitive patterns upon the surface of a said substrate. Such devices are fabricated by the successive, repetitive utilization of masks and similar devices such as a stepper lens upon such substrate surfaces. Where a mask includes a flaw in a particular element, the flaw will become manifest in a series of defective devices as the mask is successively utilized across the surface. Similarly, an aberration in a stepper lens will create a series of defects.

The detection of repetitive defects is undertaken by determining the value of a parameter such as the electrical resistance of devices fabricated upon the wafer surface. Other measurable parameters would include line width, plating thickness and the like, though the detailed description of the present invention will reference the electrical resistance by way of example. Devices are selected in a group, such as a column of devices upon the wafer surface, where the repetitive defect will occur multiple times. In the defect testing method, the electrical resistance of each of the devices in the group is determined. The mean electrical resistance of the group is determined and the electrical resistance of each device is compared to the mean to determine a percent deviation of each device from the mean. Thereafter, the percent deviation of all of the devices in the group are multiplied together to create a multiplied percent deviation number that is reflective of the deviation of the electrical resistance of the devices within the group from the mean. The multiplied percent deviation number is then compared with a figure of merit value to make a determination of whether defective devices exist within the group. Where the multiplied percent deviation number is less than the figure of merit, it is taken that none of the devices within the group is defective, and where the multiplied percent deviation number is greater than the figure of merit, it is indicative that defective devices created as a result of a repetitive pattern defect exist within the group.

It is an advantage of the method for detecting defects of the present invention that repetitive pattern defects are detected.

It is another advantage of method for detecting defects of the present invention that the defects are detected at the wafer fabrication level of the devices.

It is a further advantage of the method for detecting defects of the present invention that device fabrication costs and time are reduced because defects are detected at the wafer fabrication level.

It is yet another advantage of the defect detection method of the present invention that defects in tape recording heads are more accurately determined.

It is yet a further advantage of the method for detecting defects of the present invention that defects in individual sensors of tape recording heads can be identified, such that the recording head having such defective sensors can be identified earlier in the fabrication process.

These and other features and advantages of the present invention will no doubt become apparent to those skilled in the art upon reading the following detailed description which makes reference to the several figures of the drawing.

IN THE DRAWINGS

The following drawings are not made to scale as an actual device, and are provided for illustration of the invention described herein.

DETAILED DESCRIPTION OF THE PREFERRED EMBODIMENTS

Figure 1:
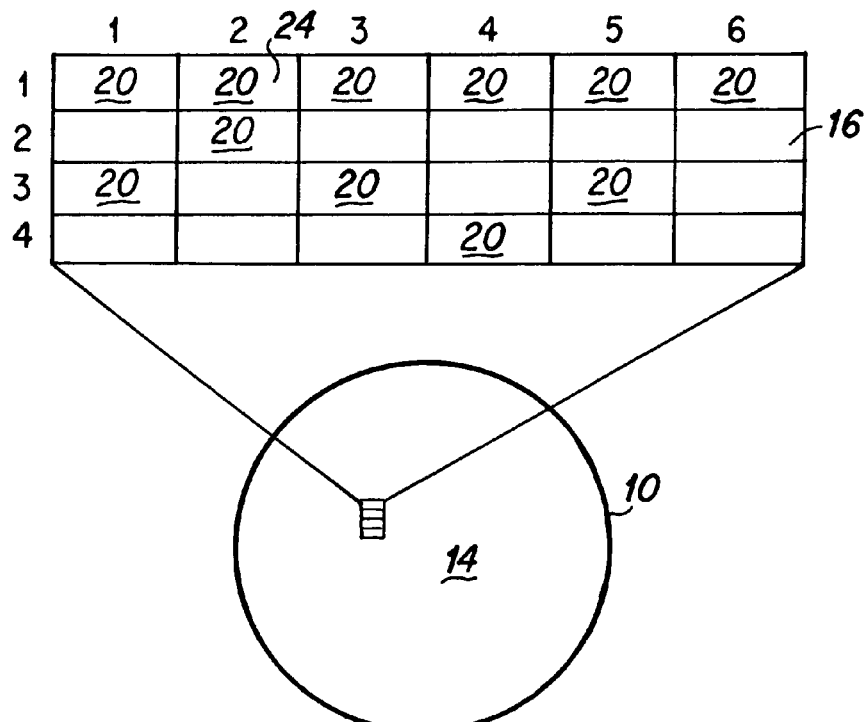
FIG. 1 is a diagram depicting the use of a fabrication mask upon the surface of a wafer substrate during device fabrication.

Recording heads for tape drives and hard disk drives, as well as many other types of devices, are fabricated in large numbers upon the surface of waver substrates, and FIG. 1 is a generalized depiction of a fabrication step during the manufacturing of such devices. As depicted in FIG. 1, a plurality of devices are simultaneously fabricated in rows and columns upon the surface 14 of a wafer substrate 10. An exemplary mask 16, as is utilized in the many photolithographic process steps to define the various elements of the devices, is shown above the wafer substrate 10. The exemplary mask has rows 1, 2, 3, 4 and columns 1, 2, 3, 4, 5, 6. In such photolithographic process steps, the mask 16 is used successively at different locations across the wafer surface to fabricate the elements of the devices. As is well known to those skilled in the art, many different such masks (not depicted) are utilized in the many process steps that are conducted to create the many devices upon the wafer surface.

As can be seen in FIG. 1, the mask includes a plurality of discrete mask elements 20 for the plurality of devices that are arranged in rows and columns, and it is intended that each element throughout each row and throughout each column be identical. However, flaws will often occur in such masks at one or more of the mask element locations. As a result, such flaws get repetitively created in the devices as the mask 16 is repetitively utilized across the surface of the wafer. Therefore, for instance, if a flaw were to exist in the mask element 24 located at row 1, column 2, each time the mask is repetitively utilized across the wafer surface, the device on the substrate surface that is then located at row 1, column 2, will be created with the flawed mask element.

Figure 2:
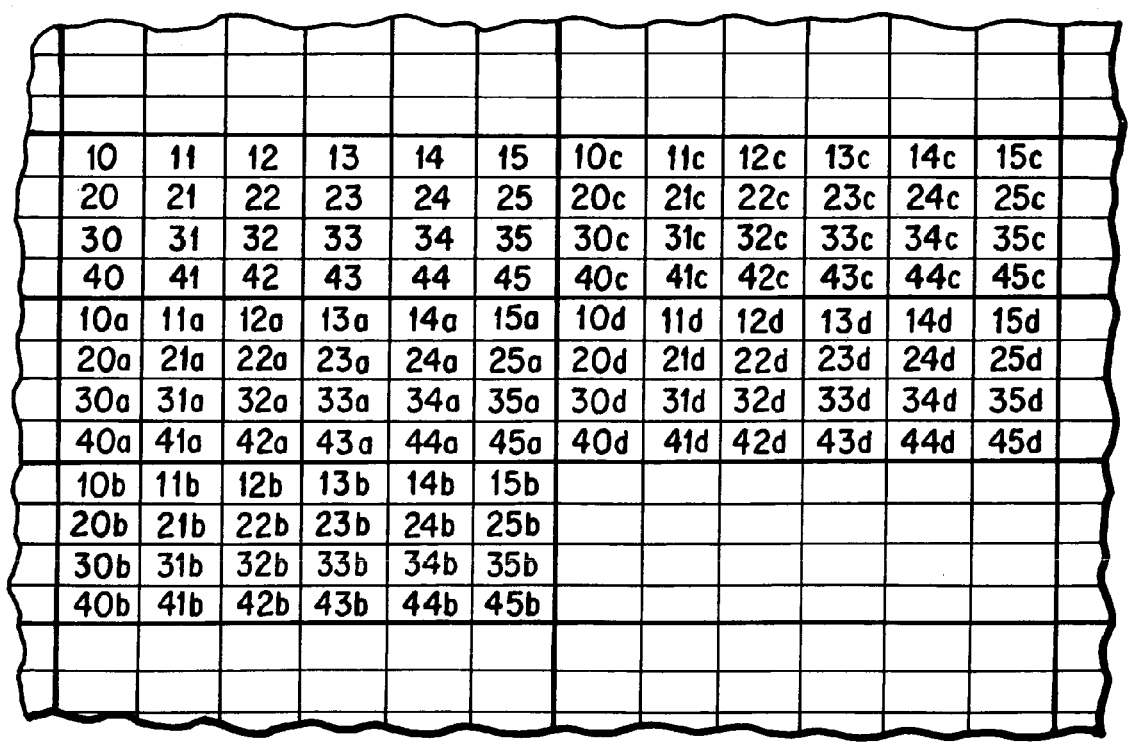
FIG. 2 is an enlarged view of a wafer surface having a plurality of devices fabricated thereon to the successive repetitive use of a fabrication mask.

FIG. 2 is a closer view of a wafer surface showing the repetitive mask application on the wafer surface. While the devices upon a wafer surface will be arranged in many rows and many columns, FIG. 2 depicts a portion of a wafer surface including a plurality of rows and columns. For purposes of explanation, the devices depicted on the wafer surface of FIG. 2, were created in part, utilizing a mask having four rows and six columns (such as is depicted in FIG. 1), and the outline borders of the mask are depicted in the darker black rectangles. It can be seen that the mask has been repetitively applied upon the wafer surface.

With regard to FIG. 2 and the application of the mask to the substrate devices, a first row of the mask is utilized to create devices in the six columns designated as 10, 11, 12, 13, 14 and 15. A second row of the mask is used to create devices 20, 21, 22, 23, 24 and 25; a third row of the mask is used to create devices 30, 31, 32, 33, 34 and 35, and the fourth row is used to create devices 40, 41, 42, 43, 44 and 45. The fifth, sixth, seventh and eighth rows involve devices that were created by a repositioning of the mask that was utilized to create the first four rows. Therefore the devices in row five are designated as 10*a*, 11*a*, 12*a*, 13*a*, 14*a* and 15*a*; the devices in row six are designated as 20*a*, 21*a*, 22*a*, 23*a*, 24*a* and 25*a*; and the devices in row seven are designated as 30*a*, 31*a*, 32*a*, 33*a*, 34*a* and 35*a* and the devices in row eight are designated as 40*a*, 41*a*, 42*a*, 43*a*, 44*a* and 45*a*. Similarly with regard to rows nine, ten, eleven and twelve, which involve successive repositioning of the mask, the devices in row nine are designated as 10*b*, 11*b*, 12*b*, 13*b*, 14*b* and 15*b*; the devices in row ten are designated as 20*b*, 21*b*, 22*b*, 23*b*, 24*b* and 25*b*; and the devices in row eleven are designated as 30*b*, 31*b*, 32*b*, 33*b*, 34*b* and 35*b*, and the devices in row twelve are designated as 40*b*, 41*b*, 42*b*, 43*b*, 44*b* and 45*b*.

As is further depicted in FIG. 2, the mask is successively repositioned to the right side of the devices described immediately above such that a row to the right of the first row of the mask, as described above, includes devices designated as 10*c*, 11*c*, 12*c*, 13*c*, etc., and a row therebelow includes devices designated as 20*c*, 21*c*, 22*c*, etc., and the devices in the next row are designated as 30*c*, 31 *c*, 32*c*, etc. and the devices in the next row include 40*c*, 41*c*, 42*c*, etc. Similarly, with regard to rows therebelow, they include devices designated as 10*d*, 11*d*, 12*d*, 13*d*, etc., and the devices in the row therebelow are designated as 20*d*, 21*d*, 22*d*, etc. It is therefore to be understood that the mask 16 is repositioned successively in the creation of successive sets of devices.

It can now be understood that where a particular mask element contains a flaw, the devices that are created utilizing the mask element will be likewise flawed. For instance, if the mask element at the position of row 1, column 2 contains a flaw, then the devices 11, 11*a*, 11*b*, 11*c*, 11*d*, etc., will each be flawed due to the repetitive use of the mask which contains the flaw in that position. However, devices such as 10, 10*a*, 10*b*, 10*c*, 10*d*, etc., 12, 12*a*, 12*b*, etc. will not flawed as the mask element for these devices was not flawed. Another fabrication device that can cause a repetitive series of defects is a stepper lens that has an aberration, and the present invention can be applied in the detection of defects from such a defective device.

Recording heads that are fabricated utilizing the photolithographic process steps, and the like, are generally tested for flaws by an electrical resistance test. In this test, the electrical resistance of each device is determined, and devices having a significant deviation in resistance are identified as being defective.

Figure 3:
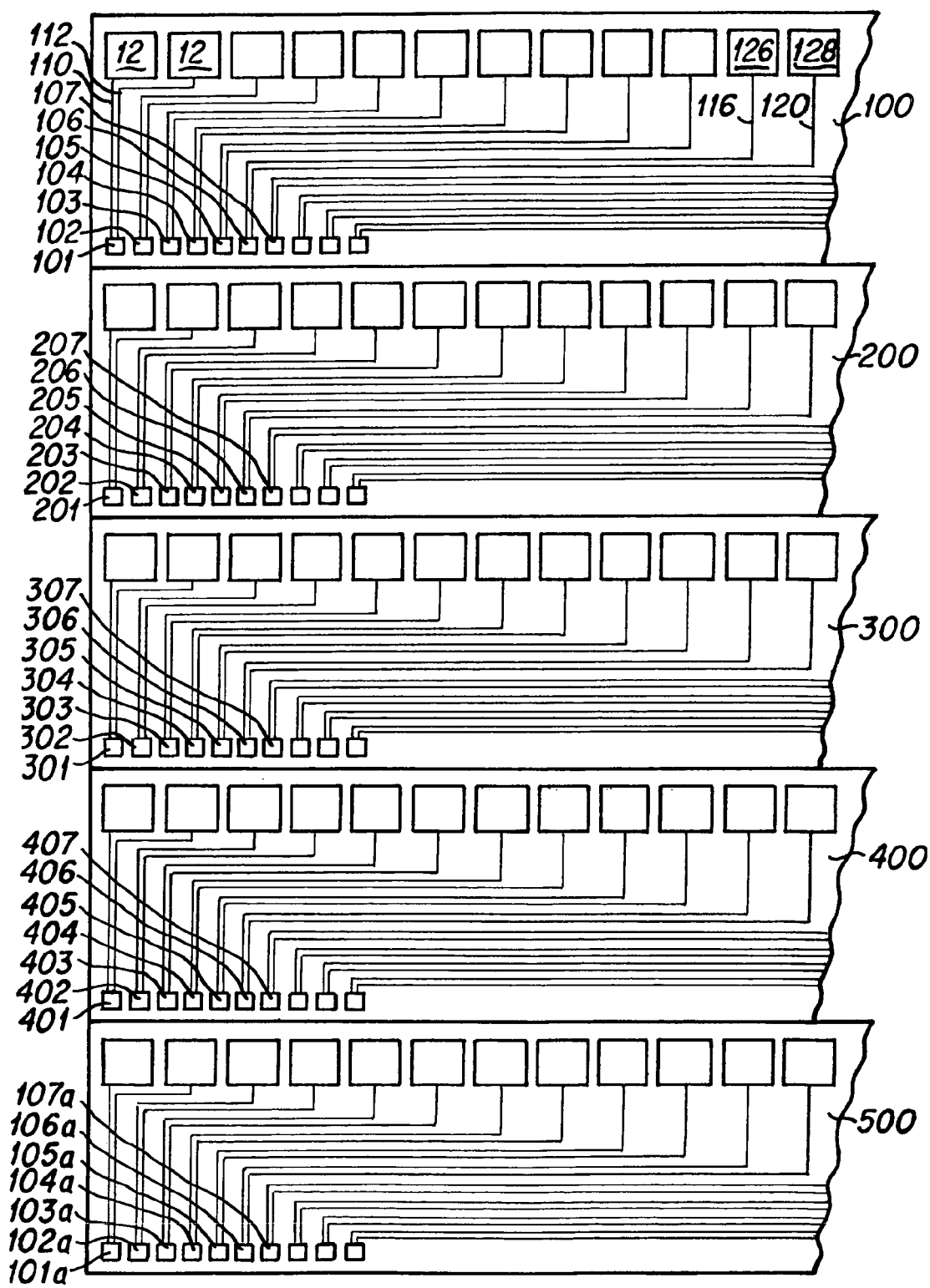
FIG. 3 is an enlarged view of a plurality of tape recording head devices, each including a plurality of sensors.

A particular problem exists in performing such resistance tests for tape drive heads and similar devices due to the nature of such heads. Particularly, a tape drive head is generally fabricated with a plurality of sensor devices arrayed side by side, and FIG. 3 depicts several tape heads as fabricated upon a wafer substrate. As depicted in FIG. 3, an exemplary tape head 100 includes a plurality of sensor devices 101–107, where a typical tape head may have perhaps 18 such sensors. Tape head 200 includes sensors 201–207, tape head 300 includes sensors 301–307, and tape head 400 includes sensors 401–408. Tape head 500 is a successive mask application of tape head 100 and includes sensors 101*a*–107*a*. This repetitive pattern for the sensors is carried out across the surface of the wafer. Each sensor is electrically connected to two contact pads by two electrical leads. Significantly, due to the geometry of the size and spacing of the contact pads, and the size and spacing of the sensors, the length of the electrical leads for each sensor device differs. For instance, the electrical leads 110 and 112 for sensor 101 are of different length than the electrical leads 116 and 120 for sensor 106.

Figures 4, 5:
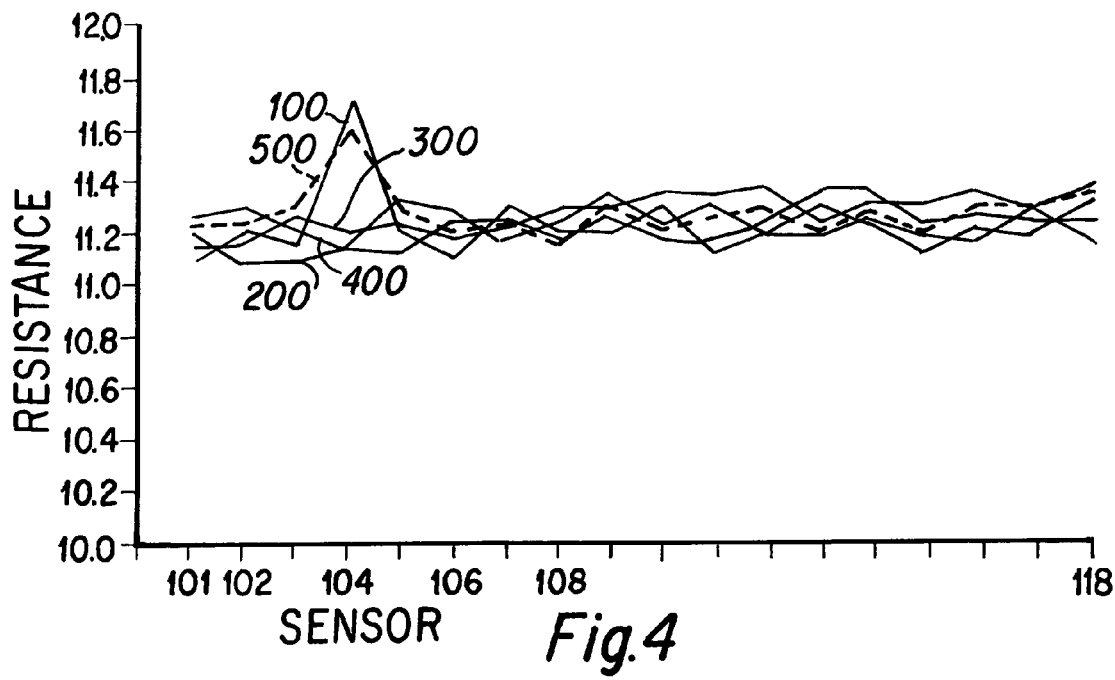
FIG. 4 is a graph depicting the electrical resistance values of sensors of a recording head such as are depicted in FIG. 3.
FIG. 5 is a representation of the tape recording head depicted in FIG. 3, where the electrical resistance value for the sensors are set forth.

In the prior art tape head fabrication and testing process, following the completion of the wafer level fabrication of the heads, the wafer is sliced into rows for further fabrication steps. Ultimately, following row level fabrication, quality testing is performed by a resistance check in which two test probes are connected to the contact pads of each sensor, such as 122 and 124 for device 101, or 126 and 128 for sensor 106, and the resistance of each of the sensor devices is obtained. Where the test resistance is within a pre-selected range, the sensor is determined to be acceptable, and sensor with a resistance beyond the range are determined to be defective. Where one sensor is determined to be bad, the entire tape head device 100 is bad. A problem with this prior art resistance testing, to which the present invention is directed, is that two sensors, such as sensors 101 and 10*c*, may be substantially identical and not defective. Yet each will have a different electrical resistance value simply due to the fact that the electrical leads to contact pads 122 and 124, and 126 and 128, respectively, are of different lengths for the two devices, as has been described above. Generally due to the fact that each sensor, such as 101, 104 and 106, have different electrical lead lengths, the test resistance of each device will differ, and FIG. 4 is a graphical depiction of the test resistances of a plurality of sensors of a tape head, where the resistance of sensor 104 (and likewise sensor 104*a*, etc.) is seen to be high, indicating a defect may exist in it. Owing to the variation in resistances, and the need to have a suitable resistance test range, approximately 5 to 7% of devices have previously been rejected where further testing revealed that many of them were not defective. They simply had electrical resistances that were beyond the test range due to variations in electrical lead lengths.

The present invention provides a test method that is more accurate. FIG. 5 is a representation of the wafer surface of FIG. 3 in which the test resistance of each sensor has been taken at the wafer fabrication level, and is written into the sensor location. Significantly, the resistance testing is performed on the wafer fabrication level, and the resistance of sensors in both columns and rows is available for analysis. A wafer may have thousands of tape head type devices, and it is desirable that a test method be developed that rapidly determines good devices as well as points towards bad ones. The present invention includes a method that allows for the rapid analysis of resistance test data.

Initially, it is significant to note that the resistance of each sensor in a tape head row will be expected to differ due in part to the differing electrical lead lengths of the sensors; while the resistance of sensors in the same column of the tape head devices can be expected to be quite similar as the lead lengths are substantially identical for sensors in the same column.

An initial step in the test method of the present invention is to determine the resistance of each sensor, as is shown in FIG. 5. Then, the resistance of each sensor in a column is added together to create a total resistance for the column. The total resistance value for the column is then divided by the number of sensors in the column to create a mean resistance for the sensors in the column. This is done for each column of sensors. Next, the deviation of each individual sensor's resistance in the column from the column mean is determined. This deviation is then divided by the mean and multiplied by 100 to create a percent deviation, which will most typically be a number greater than one. This percent deviation calculation is done for each sensor in each column. Thereafter, all of the percent deviation values for all of the sensors in a column are multiplied together. This yields a large multiplied percent deviation number that is representative of the variation of the resistance of all of the sensors in the column from the mean resistance of the sensors in the column.

In a column where all of the sensor devices are good, the deviation of the resistances of each of the good sensors from the mean will generally be small, and the multiplied percent deviation number will be of a relatively small value. In contrast thereto, in a column where a plurality of the sensors is defective, such as sensors 104, 104*a* (of tape head 500), 104*b*, etc., due to a mask defect and the repetitive usage of the mask, as described above, the multiplied percent deviation value for such a column having a plurality of defective devices will tend to be significantly larger than the column where there are good sensors.

Through the application of this resistance determination method for deriving a multiplied percent deviation number a value, termed herein a figure of merit, is determined. This figure of merit depends at least in part upon the number of devices within a column and therefore cannot be arbitrarily set. It is determined through conducting this resistance determination and mathematical analysis upon one or more wafers, and is then applied to other similarly configured wafers. Where the multiplied percent deviation number is greater than the figure of merit, it is an indication that tape heads on the wafer having a sensor within the suspect column must be further examined. In the example described herein, the further examination would reveal that tape heads including sensors 104, 104*a*, 104*b*, 104*c*, etc. are problematical, while tape heads including sensors 204, 204*a* (of tape head 200), 204*b*, etc. and 304, 304*a* (of tape head 300), 304*b*, etc. and 404, 404*a* (of tape head 400), 404*b*, etc. are not defective.

As will be clear to those skilled in the art after reading the preceding specification, the test method of the present invention is suitable for the detection of defects in devices such as tape heads, where the defects are due to the repetitive nature of the fabrication process. That is, while the present invention has been particularly described with regard to a defect in a mask that is utilized during the device fabrication process, other defects that are repetitive in nature, such as are created by a stepper lens with an aberration, are subject to the same test procedure of the present invention.

Additionally, while the test method has been particularly described with reference to the electrical resistance of each device, other repetitive device parameters may also be utilized, and the mean value and percent deviation values of the parameter may be utilized in the test method. Such other parameters include the line width of the devices and the plating thickness of the devices, which may be measured for each device, and the measured values utilized in the same manner as the electrical resistance measured values are utilized in the test method described herein.

A significant feature of the present invention is that it detects defects at an earlier stage in the fabrication process then has heretofore been accomplished in the prior art. Specifically, the present invention involves defect detection at the wafer level of fabrication, where the prior art test procedure involves defect detection at the row level of device fabrication. As a result of earlier defect detection, expensive fabrication steps and fabrication time are avoided for those devices that are identified on the wafer level as being defective.

While the present invention has been shown and described with regard to certain preferred embodiments, it is to be understood that modifications in form and detail will no doubt be developed by those skilled in the art upon reviewing this disclosure. It is therefore intended that the following claims cover all such alterations and modifications that nevertheless include the true spirit and scope of the inventive features of the present invention.

What we claim is:

1. A method for detecting defects in devices fabricated in repetitive patterns on substrates, comprising:

determining test parameter value of each fabricated device in a group of such devices disposed upon the surface of the substrate;

determining a mean test parameter value for said devices in said group;

determining a percent deviation of said test parameter value of each device from said mean test parameter value;

multiplying the percent deviation of each device together to create a multiplied percent deviation number;

comparing said multiplied percent deviation number with a figure of merit value to determine if there is one or more defective devices within said group of devices.

2. A method for detecting defects as described in claim 1, wherein said test parameter is the electrical resistance of each device.

3. A method for determining defects as described in claim 2 wherein said mean resistance value is determined by adding the electrical resistance value of each device in said group, and dividing by the number of devices in the group.

4. A method for determining defects as described in claim 3 wherein said percent deviation is determined by subtracting said mean resistance value from said electrical resistance value of each said device, and dividing by said mean resistance value, and multiplying by 100.

5. A method for detecting defects as described in claim 1, wherein said test parameter is the line width of each device.

6. A method for detecting defects as described in claim 1, wherein said test parameter is the plating thickness of each device.

7. A method for determining defects as described in claim 1, wherein said group is comprised of a column of devices disposed upon said substrate.

8. A method for determining defects as described in claim 1, wherein said devices are fabricated by successively utilizing a fabrication part across the surface of said substrate.

9. A method for determining defects as described in claim 8 wherein said fabrication part is a mask device.

10. A method for determining defects as described in claim 9 wherein said mask device is a photolithographic mask.

11. A method for determining defects as described in claim 8, wherein said fabrication part is a stepper lens.

12. A method for determining defects as described in claim 1, wherein said device is a tape recording head.

13. A method for determining defects as described in claim 12 wherein said tape recording head includes a plurality of sensors, and said fabricated device is said sensors.

14. A method for determining defects as described in claim 13 wherein the test parameter is the electrical resistance of each said sensor of a said tape head.

15. A method for determining defects as described in claim 14, wherein said sensors of said tape head are sequentially arranged in a row, and a plurality of said tape heads are created in a repetitive pattern upon said substrate, and wherein the electrical resistance of similarly situated sensors of different tape heads is utilized as said electrical resistance value.

16. A method for detecting defects in tape recording heads comprising:

fabricating said tape recording heads in a repetitive pattern upon the surface of a substrate, where each said tape recording head includes a plurality of sensors;

determining an electrical resistance value for each said sensor;

determining a mean electrical resistance value of a group of said sensors, wherein said group includes a single sensor from each said tape recording head;

determining a mean resistance value for said sensors in said group;

determining a percent deviation of said electrical resistance value of each sensor from said mean resistance value;

multiplying the percent deviation of each sensor together to create a multiplied percent deviation number;

comparing said multiplied percent deviation number with a figure of merit value to determine if there is one or more defective sensors within said group of sensors.

17. A method for determining defects as described in claim 16 wherein said mean resistance value is determined by adding the electrical resistance value of each sensor in said group, and dividing by the number of sensors in the group.

18. A method for determining defects as described in claim 16, wherein said group is comprised of a column of sensors disposed upon said substrate.

19. A method for determining defects as described in claim 16 wherein said percent deviation is determined by subtracting said mean resistance value from said electrical resistance value of each said sensor, and dividing by said mean resistance value, and multiplying by 100.

20. A method for determining defects as described in claim 16, wherein said tape recording heads are fabricated by successively utilizing a fabrication part across the surface of said substrate.

21. A method for determining defects as described in claim 20 wherein said fabrication part is a mask device.

22. A method for determining defects as described in claim 21 wherein said mask device is a photolithographic mask.

23. A method for determining defects as described in claim 20, wherein said fabrication part is a stepper lens.

* * * * *